United States Patent
Kim et al.

(10) Patent No.: US 11,853,514 B2
(45) Date of Patent: Dec. 26, 2023

(54) TOUCH SENSING SIGNAL PROCESSING CIRCUIT

(71) Applicant: LX Semicon Co., Ltd., Daejeon (KR)

(72) Inventors: Jae Duck Kim, Daejeon (KR); Kyung Hwan Kim, Daejeon (KR); Ho Jin Kang, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/751,332

(22) Filed: May 23, 2022

(65) Prior Publication Data
US 2023/0108545 A1    Apr. 6, 2023

(30) Foreign Application Priority Data
Sep. 29, 2021  (KR) .......................... 10-2021-0128572

(51) Int. Cl.
*G06F 3/044* (2006.01)
*H03M 3/00* (2006.01)

(52) U.S. Cl.
CPC ............ *G06F 3/044* (2013.01); *H03M 3/464* (2013.01); *H03M 3/496* (2013.01)

(58) Field of Classification Search
CPC .......... G06F 3/044; H03M 3/43; H03M 3/456; H03M 3/458; H03M 3/464; H03M 3/496; H03F 3/087
See application file for complete search history.

(56) References Cited

U.S. PATENT DOCUMENTS

| | | | |
|---|---|---|---|
| 10,061,415 B2 | 8/2018 | Bohannon et al. | |
| 2002/0080056 A1* | 6/2002 | Karanicolas | G05F 3/242 341/155 |
| 2007/0075710 A1* | 4/2007 | Hargreaves | G01R 27/2605 324/754.28 |
| 2017/0033688 A1 | 2/2017 | Nikitin | |
| 2017/0344144 A1* | 11/2017 | Pedersen | G06F 3/041 |
| 2018/0059861 A1* | 3/2018 | Kim | G06F 3/044 |
| 2018/0172744 A1* | 6/2018 | Chang | H03K 17/962 |
| 2020/0210046 A1* | 7/2020 | Lee | G06F 3/04186 |

FOREIGN PATENT DOCUMENTS

KR   2011-0026812 A   3/2011

* cited by examiner

*Primary Examiner* — Hong Zhou
(74) *Attorney, Agent, or Firm* — POLSINELLI PC

(57) ABSTRACT

The present disclosure discloses a touch sensing signal processing circuit which senses a change in capacitance of a sensing node for touch sensing and provides a logic signal corresponding to the touch sensing. The touch sensing signal processing circuit of the present disclosure is configured using a delta-sigma analog to digital converter. Auto-tuning may be performed by delta-sigma analog conversion.

14 Claims, 3 Drawing Sheets

TOUCH SENSING SIGNAL PROCESSING CIRCUIT

BACKGROUND

1. Technical Field

The present disclosure relates to a touch sensing signal processing circuit, and more particularly, to a touch sensing signal processing circuit which senses a change in capacitance of a sensing node for touch sensing and provides a logic signal corresponding to touch sensing.

2. Related Art

A display panel may be configured to have a display function and a touch sensing function. The display function is to display a screen through pixels. The touch sensing function is to sense a touch on a screen for a data input for each sensing node.

The touch sensing function may be implemented in a display panel in various ways. For example, a plurality of sensing nodes for touch sensing may be implemented in a display panel by using an on-cell or in-cell method.

Sensing nodes may be disposed in the display panel based on a preset pattern. Driving signals may be provided to the sensing nodes for touch sensing.

Touch sensing may be sensed based on a change in capacitance of each sensing node. That is, a touch sensing signal corresponding to capacitance changed in response to touch sensing may be outputted from the sensing nodes in response to the driving signals.

An analog front end (AFE) for receiving and processing a touch sensing signal is configured. The AFE corresponds to a touch sensing signal processing circuit of the present disclosure.

A common touch sensing signal processing circuit is configured to sense a touch sensing signal corresponding to a touch driving signal and to output a digital logic signal corresponding to a sensing result.

To this end, the touch sensing signal processing circuit includes a plurality of channels for receiving touch sensing signals of a plurality of sensing nodes, and is configured to generate a sampling signal corresponding to touch sensing while selecting the plurality of channels one by one and to output a digital signal corresponding to the sampling signal.

In general, the touch sensing signal processing circuit may be configured to include an offset capacitance tuning circuit, a pre-amplifier, an integrator, a sample and hold circuit, a multiplexer, an analog to digital converter (hereinafter referred to as an "ADC") and a logic filter for each channel.

The touch sensing signal processing circuit may include the pre-amplifier and the offset capacitance tuning circuit in order to prevent saturation attributable to a great panel load. Among them, the pre-amplifier needs to be configured to have a feedback capacitor having an increased size. The offset capacitance tuning circuit needs to be configured to include a tuning capacitor in order to tune an offset between panels. The feedback capacitor and the tuning capacitor may cause an increase in mounting areas when the number of channels is increased.

Furthermore, the multiplexer has an M:1 structure. In order to satisfy the multiplexer, the ADC requires a high-speed sample and hold circuit. The high-speed sample and hold circuit may cause an increase in current consumption and chip sizes.

The number of sensing nodes and channels for touch sensing may increase as the size and resolution of a display panel are increased.

In this case, the touch sensing signal processing circuit requires as many parts as the increased number of channels, and requires a large area for disposing the parts. Furthermore, a control target that needs to be tuned within the touch sensing signal processing circuit is increased. To this end, logic registers may be increased. Furthermore, there is a difficulty in the layout of many parts in a limited area, and there is a difficulty in routing between the parts.

SUMMARY

Various embodiments are directed to providing a touch sensing signal processing circuit which may be simply configured using a small number of parts.

Also, various embodiments are directed to reducing an area and the number of parts for a touch sensing signal processing circuit by adopting a delta-sigma analog to digital conversion method and enabling a touch sensing signal processing circuit to accommodate an increased number of channels.

Furthermore, various embodiments are directed to providing a touch sensing signal processing circuit capable of securing a touch sensing time for an increased number of channels and improving a signal to noise ratio by an increased touch sensing time.

Furthermore, various embodiments are directed to providing a touch sensing signal processing circuit capable of reinforcing digital filtering by including an ADC for each channel.

In an embodiment, a touch sensing signal processing circuit may include a pre-amplification circuit configured to compare a touch sensing signal corresponding to a change in capacitance of a sensing node for touch sensing and a touch driving signal for driving the touch sensing and to output a sensing current corresponding to a result of the comparison and a delta-sigma analog to digital converter (ADC) configured to generate a sampling voltage obtained by sampling the sensing current, output a digital signal corresponding to the sampling voltage, and tune the sampling voltage by using the digital signal.

Accordingly, the present disclosure can simply construct the touch sensing signal processing circuit by using a small number of parts. More specifically, the present disclosure can reduce an area and the number of parts for the touch sensing signal processing circuit by adopting the delta-sigma analog to digital conversion method.

Accordingly, the touch sensing signal processing circuit of the present disclosure can be configured to accommodate an increased number of channels corresponding to a reduced number of parts, and can further secure a touch sensing time that much and improve a signal to noise ratio by an increased touch sensing time.

Furthermore, the touch sensing signal processing circuit of the present disclosure may achieve high-resolution analog-to-digital conversion performance by a simple construction, and can reduce power consumption per channel.

Furthermore, the touch sensing signal processing circuit of the present disclosure can reinforce digital filtering by including the ADC for each channel.

DETAILED DESCRIPTION

The present disclosure discloses an embodiment of a touch sensing signal processing circuit. The touch sensing signal processing circuit may be configured to sense a touch on a touch panel and to output a digital logic signal corresponding to the touch sensing.

Figure 1:
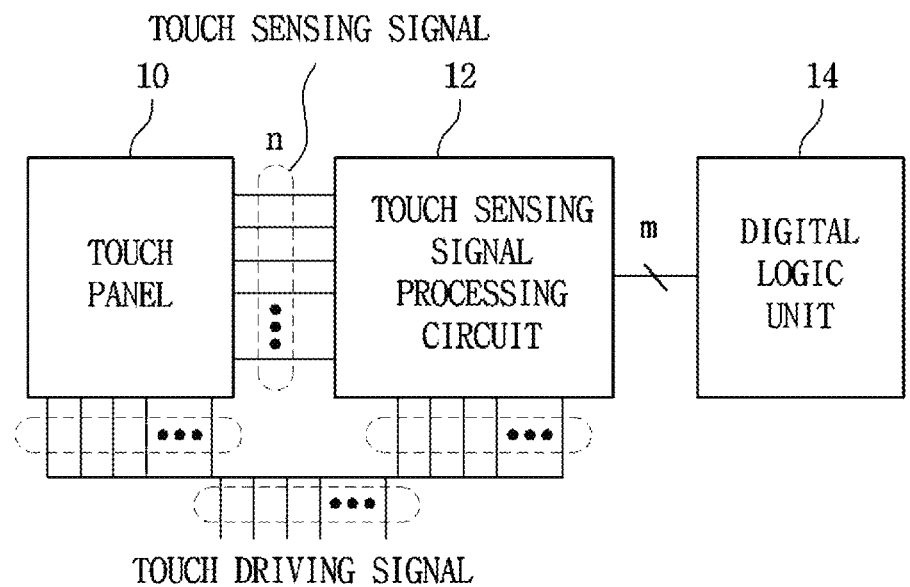
FIG. 1 is a block diagram illustrating a touch system.

An embodiment of a touch sensing signal processing circuit according to the present disclosure may be configured in a touch system as in FIG. 1.

The touch system of FIG. 1 may be configured to include a touch panel 10, a touch sensing signal processing circuit 12 and a digital logic unit 14. Among them, the touch sensing signal processing circuit 12 may be understood to correspond to an analog front end (AFE) that senses a current corresponding to a touch on the touch panel 10.

The touch panel 10 may be combined with a display panel (not illustrated) by using a method, such as on-cell or in-cell. The display panel may be driven in a display period, and the touch panel may be driven in a touch period. The touch period may be disposed between preset display periods.

The touch panel 10 may include sensing nodes (not illustrated) formed by driving lines (not illustrated) and sensing lines (not illustrated). An equivalent capacitor may be formed at each adjacent location by the intersection of the driving line and the sensing line, etc. The sensing node may be understood as corresponding to the equivalent capacitor. The driving lines, the sensing lines and the sensing nodes formed by the driving lines and the sensing lines may be formed in various ways, and thus a more detailed example and description are omitted.

A touch driving signal may have a sine wave or a square wave, and is periodically inputted to the driving lines of the touch panel 10 for touch sensing.

Touch sensing signals are generated by the touch driving signal inputted to the touch sensing signal processing circuit 12. When a touch is not present, the touch driving signal of the touch driving line and the touch sensing signal driven on the touch sensing signal processing circuit 12 have the same voltage and the same phase. Accordingly, the touch driving signal and the touch sensing signal are offset in equivalent capacitors between the driving line and sensing line of the touch panel 10. As a result, a current does not occur. However, when a touch is present, an additional capacitor is formed in the sensing node, and a voltage of the touch driving signal is relatively lowered. An additional current for compensating for a voltage difference occurring for the above reason is generated by the touch sensing signal processing circuit 12. The additional current generated in this case may be understood as the touch sensing signal.

The touch driving signal may be understood to be provided by a preset driving circuit (not illustrated). In this case, the driving circuit may have a construction for generating and providing the touch driving signal having a preset frequency.

The touch panel 10 may include a plurality of (e.g., n which is a plurality of natural numbers) channels for outputting a plurality of touch sensing signals. The touch sensing signal may be outputted for each channel.

The touch sensing signal processing circuit 12 may include the same number of channels as the touch panel 10, and may receive a plurality of touch sensing signals VIN of the sensing nodes through the channels. Furthermore, the touch sensing signal processing circuit 12 may receive touch driving signals.

The touch sensing signal processing circuit 12 may provide the digital logic unit 14 with a digital logic signal obtained by sequentially processing the plurality of touch sensing signals VIN by using the touch driving signals. In this case, the logic signal may be provided to have a plurality of bits (e.g., m bits where the m is a plurality of natural numbers). A construction and operation of the touch sensing signal processing circuit 12 are described later with reference to FIGS. 2 to 5.

The digital logic unit 14 may be configured to filter out noise from the digital logic signal, determine a touch location and control an operation corresponding to a touch. The digital logic unit 14 can be designed to have various functions depending on a manufacturer's intention, and a description thereof is omitted.

Figure 2:
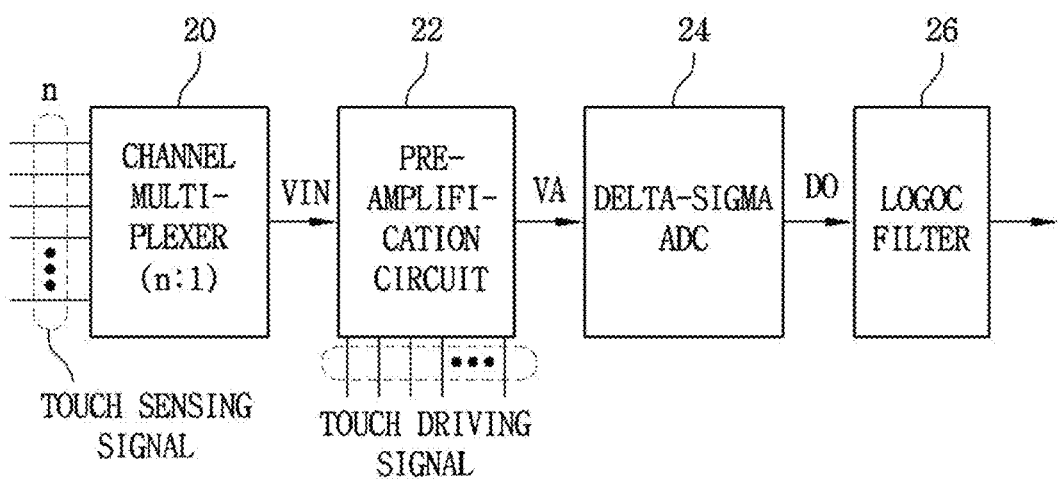
FIG. 2 is a block diagram illustrating a touch sensing signal processing circuit according to the present disclosure.

The touch sensing signal processing circuit 12 may be described with reference to FIG. 2.

The touch sensing signal processing circuit 12 may be configured to include a channel multiplexer 20, a pre-amplification circuit 22, a delta-sigma ADC 24 and a logic filter 26.

The channel multiplexer 20 is configured to receive input signals through n channels, sequentially select the input signals therein one by one, and output the selected input signals to the pre-amplification circuit 22. That is, the channel multiplexer 20 may be configured to have a ratio of output to input of n:1. n input signals correspond to the touch sensing signals VIN. The channel multiplexer 20 may be configured to select one of n touch sensing signals VIN in response to an internal or external control signal and to output the selected touch sensing signal VIN.

The touch sensing signals VIN of the channel multiplexer 20 may be understood to have the amount of current corresponding to capacitance changed depending on whether a touch is present in the sensing nodes of the touch panel 10. In FIG. 2, the touch sensing signals of the channel multiplexer 20 correspond to a voltage sensed in the pre-amplification circuit 22, and are indicated as VIN. That is, the channel multiplexer 20 may be understood to output a current signal having the amount of current corresponding to touch sensing.

The pre-amplification circuit 22 may receive the touch sensing signal VIN outputted by the channel multiplexer 20, and may receive the touch driving signals. The pre-amplification circuit 22 may be configured to compare the touch sensing signal VIN and a touch driving signal VLFD for driving touch sensing and to output a sensing current VA corresponding to a result of the comparison. In this case, the touch driving signal VLFD may be understood to correspond to a touch driving signal of a corresponding channel selected among the touch driving signals. Furthermore, the touch driving signal VLFD may be understood to correspond to the touch sensing signal VIN whose amplitude, etc. has been changed in consideration of a level of the touch sensing signal VIN without using the touch driving signal of a corresponding channel without any change. A detailed construction and operation of the pre-amplification circuit 22 are described later with reference to FIGS. 3 and 4.

Furthermore, the delta-sigma ADC 24 is configured to generate a sampling voltage obtained by sampling the sensing current VA provided by the pre-amplification circuit 22, output a digital signal DO corresponding to the sampling voltage, and tune the sampling voltage by using the digital signal DO. A detailed construction and operation of the delta-sigma ADC 24 are described later with reference to FIG. 5.

Furthermore, the logic filter 26 is configured to output a logic signal obtained by filtering out noise of the digital signal DO provided by the delta-sigma ADC 24.

More specifically, the logic filter 26 includes one filter selected among a decimation filter and a sliding discrete Fourier transfer (SDFT) filter, and may remove quantization noise of a non-signal band from the digital signal DO through the selected filter.

Figure 3:
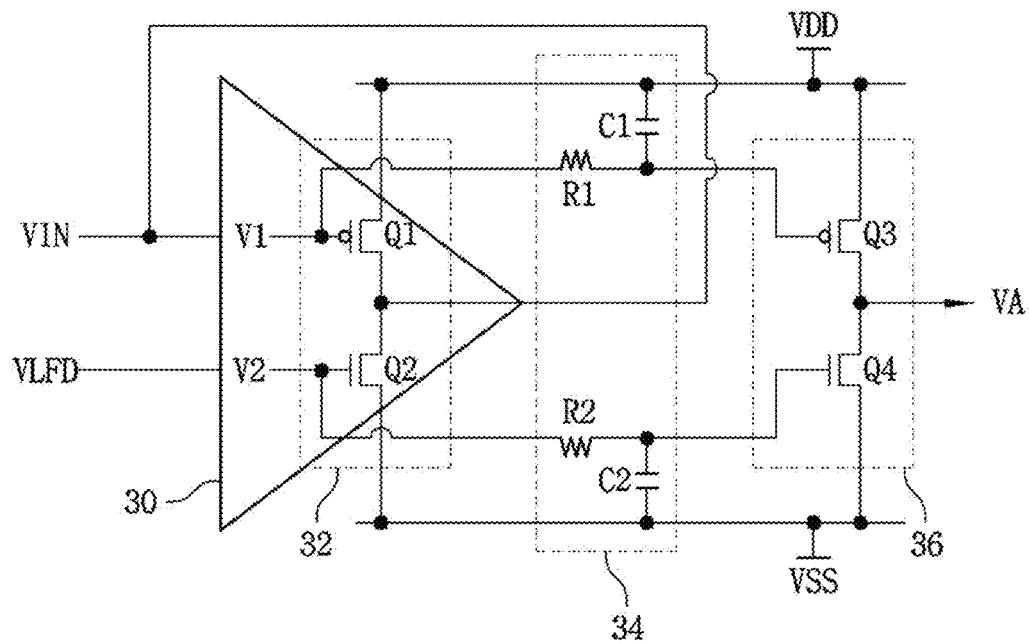
FIG. 3 is a circuit diagram illustrating a pre-amplification circuit.
Figure 4:
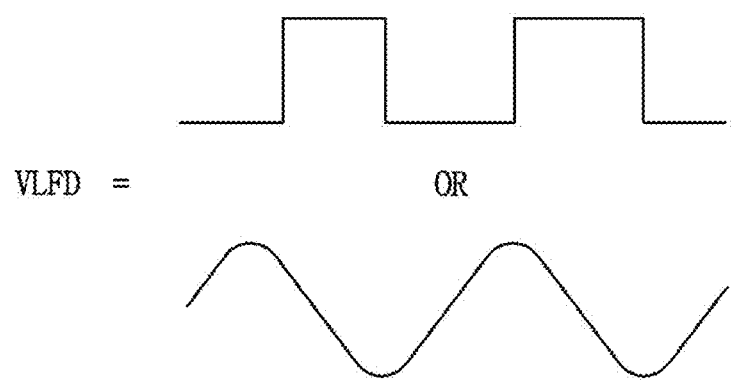
FIG. 4 is a waveform diagram illustrating a touch driving signal.

First, a detailed construction and operation of the pre-amplification circuit 22 are described with reference to FIGS. 3 and 4.

The pre-amplification circuit 22 is configured to include a buffer 30, a low pass filter 34 and an output circuit 36.

The pre-amplification circuit 22 is configured to output the sensing current VA corresponding to the touch sensing signal VIN. The sensing current outputted by the pre-amplification circuit 22 is sampled as a sampling voltage by an integrator 40 of the delta-sigma ADC 24 to be described later. Accordingly, the sensing current is indicated as VA in consideration of the sampling voltage.

First, the buffer 30 may include a first input stage for receiving the touch sensing signal VIN, a second input stage for receiving the touch driving signal VLFD and an output stage for outputting a result of comparing the touch sensing signal VIN and the touch driving signal VLFD. The buffer 30 may have a structure in which a signal of the output stage is fed back to the first input stage. Although not specifically indicated, the first input stage may be understood as a negative input stage of the buffer 30, and the second input stage may be understood as a positive input stage of the buffer 30. Furthermore, the touch driving signal VLFD may be understood to correspond to the touch driving signal of a corresponding channel or the touch driving signal of a corresponding channel whose amplitude, etc. has been changed, as described above.

The pre-amplification circuit 22 may be configured using a unit gain buffer. That is, the buffer 30 may be understood as the unit gain buffer. The pre-amplification circuit 22 using the unit gain buffer may have an advantage in terms of heavy panel loading.

The buffer 30 may include an input stage (not illustrated) and an internal circuit 32 therein.

The input stage may be understood as a stage for generating a first control signal V1 and a second control signal V2 which are driven based on a difference between the touch sensing signal VID of the first input stage and the touch driving signal VLFD of the second input stage. That is, the input stage may be understood to convert the touch sensing signal VIN and the touch driving signal VLFD into the first control signal V1 and the second control signal V2 each having a voltage level suitable for being provided to the internal circuit 32.

The internal circuit 32 may be configured to output, through the output stage of the buffer 30, an output corresponding to a difference between the touch sensing signal VIN and the touch driving signal VLFD by the first control signal V1 and the second control signal V2. The internal circuit 32 may be understood to include a PMOS transistor Q1 driven by the first control signal V1 applied to the gate thereof and an NMOS transistor Q2 driven by the second control signal V2 applied to the gate thereof. The drains of the PMOS transistor Q1 and the NMOS transistor Q2 is configured to be connected in common. A driving voltage VDD is applied to the source of the PMOS transistor Q1, and a ground voltage VSS is applied to the source of the NMOS transistor Q2.

The internal circuit 32 may output a voltage corresponding to a current driven by the first control signal V1 and the second control signal V2.

In the pre-amplification circuit 22, the output circuit 36 has the same structure as the internal circuit 32 of the buffer 30.

That is, the output circuit 36 may be understood to include a PMOS transistor Q3 driven by the first control signal V1 applied to the gate thereof and anNMOS transistor Q4 driven by the second control signal V2 applied to the gate thereof. The drains of the PMOS transistor Q3 and the NMOS transistor Q4 is configured to be connected in common. The driving voltage VDD is applied to the source of the PMOS transistor Q3. The ground voltage VSS is applied to the source of the NMOS transistor Q4. In this case, the PMOS transistor Q3 and NMOS transistor Q4 of the output circuit 36 may be configured to include channels having a size equal to or greater than the size of the channels of the PMOS transistor Q1 and NMOS transistor Q2 of the internal circuit 32.

The internal circuit 32 and the output circuit 36 of the buffer 30 may form a current mirror. The output circuit 36 may output the sensing current VA mirrored from an internal current of the internal circuit 32.

A current mirror ratio of the output circuit 36 and the internal circuit 32 may vary. A range of the sensing current VA may vary by the variation of the current mirror ratio.

Furthermore, the touch driving signal VLFD inputted to the buffer 30 may have the same waveform and phase as the touch driving signal applied to the sensing nodes of the touch panel 10.

The touch driving signal may be provided to have a square wave or a sine wave having a preset frequency. As in FIG. 4, the touch driving signal VLFD may be provided to have a square wave or a sine wave having the same waveform and phase as those of the touch driving signal.

The touch driving signal VLFD may have a waveform and phase similar to a waveform and phase of the touch sensing signal VIN because the touch driving signal has the same waveform and phase as those of the touch driving signal. As a result, the degradation of touch sensing performance can be prevented.

Furthermore, the pre-amplification circuit 22 includes the low pass filter 34 including a filtering capacitor. The low pass filter 34 may filter the first control signal V1 and the second control signal V2 transferred from the buffer 30 to the output circuit 36 by using the filtering capacitor.

To this end, the low pass filter 34 includes a first capacitor C1 and a second capacitor C2 as the filtering capacitor. The first capacitor C1 is configured between a node to which the driving voltage VDD is applied and a wire along which the first control signal V1 is transferred from the buffer 30 to the output circuit 36. The second capacitor C2 is configured between a node to the ground voltage VSS is applied and a wire along which the second control signal V2 is transferred from the buffer 30 to the output circuit 36. Furthermore, a resistor R1 is configured in the wire along which the first control signal V1 is transferred from the buffer 30 to the output circuit 36. A resistor R2 is configured in the wire along which the second control signal V2 is transferred from the buffer 30 to the output circuit 36.

In the low pass filter 34, the first capacitor C1 filters a peak component of the first control signal V1 corresponding to the touch sensing signal VIN. The second capacitor C2 filters a peak component of the second control signal V2 corresponding to the touch driving signal VLFD.

The delta-sigma ADC 24 is configured to generate a sampling voltage obtained by integrating the sensing current VA, output a quantized digital signal DO by comparing the sampling voltage with a preset reference voltage VCM, and tune the sampling voltage by feeding back the digital signal DO.

Figure 5:
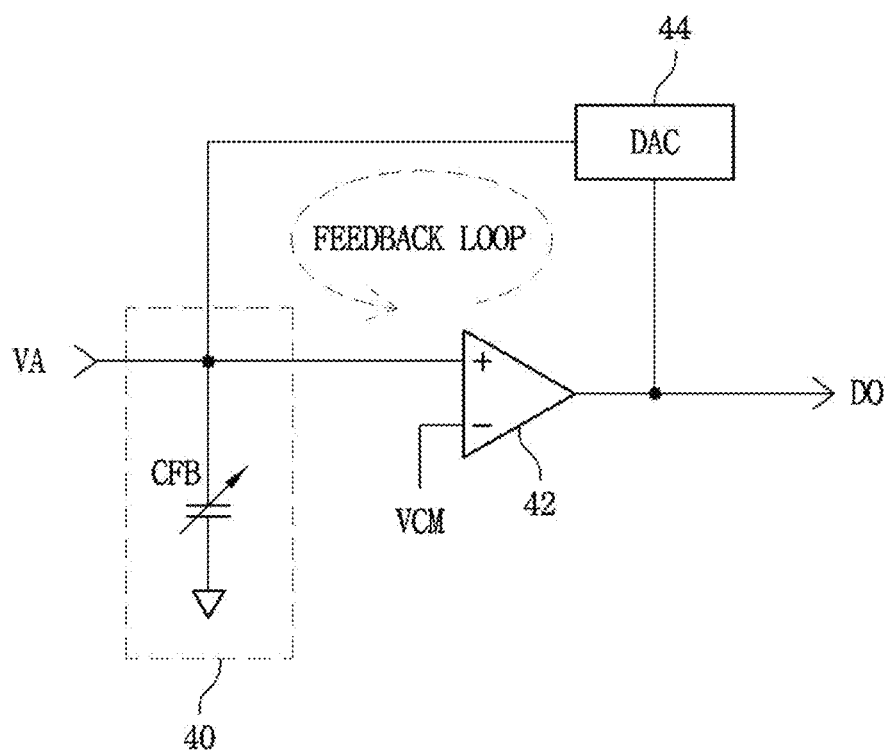
FIG. 5 is a circuit diagram illustrating a delta-sigma ADC.

To this end, as in FIG. 5, the delta-sigma ADC 24 may include the integrator 40, a comparator 42 and a digital to analog converter (hereinafter referred to as a "DAC") 44.

The integrator 40 may include a variable capacitor CFB for integrating the sensing current VA. The variable capacitor CFB is configured in parallel to a node to which the sensing current VA is inputted.

The variable capacitor CFB may generate the sampling voltage obtained by integrating the sensing current VA accumulated by storing the sensing current VA. Furthermore, the variable capacitor CFB may be tuned in order to adjust the amount of charging.

The comparator 42 may receive the sampling voltage, accumulated in the variable capacitor CFB, through a positive input stage (+), may receive the reference voltage VCM having a preset level through a negative input stage (−), and may output the digital signal DO having a digital value having a high or low level corresponding to a result of comparing the sampling voltage and the reference voltage VCM. That is, the comparator 42 may output the digital signal DO having a value quantized based on a level of the sampling voltage.

The DAC 44 is configured to receive the digital signal DO and to tune the sampling voltage of the integrator 40 by feedback of the digital signal DO. That is, the DAC may form a feedback loop.

The DAC 44 may tune the sampling voltage of the integrator 40 by applying, to the integrator 40, positive charges (+) or negative charges (−) corresponding to the digital signal DO.

More specifically, the DAC 44 may perform an operation of lowering the sampling voltage of the integrator 40 by applying negative charges (−) in response to the digital signal DO having a logic high value or may perform an operation of raising the sampling voltage of the integrator 40 by applying positive charges (+) in response to the digital signal DO having a logic low value.

To this end, the DAC 44 may include a voltage control circuit for applying positive charges (+) or negative charges (−) to the integrator 40 in response to the digital signal DO.

In contrast, the DAC 44 may tune the sampling voltage of the integrator 40 by charging the integrator 40 with a current corresponding to the digital signal DO or discharging a current, with which the integrator 40 is charged, in response to the digital signal DO.

More specifically, the DAC 44 may perform an operation of lowering the sampling voltage of the integrator 40 by discharging a current, with which the variable capacitor CFB of the integrator 40 is charged, in response to the digital signal DO having a logic high value or may perform an operation of raising the sampling voltage of the integrator 40 by charging the variable capacitor CFB of the integrator 40 with a current in response to the digital signal DO having a logic low value.

To this end, the DAC 44 may include a charging and discharging control circuit for supplying a current to the integrator 40 in response to the digital signal DO or discharging a current of the integrator 40.

The delta-sigma ADC 24 may output the quantized digital signal DO through the quantization process of the sensing current VA.

An embodiment of the present disclosure configured as described above may have a dynamic range improvement function by the touch driving signal VLFD.

When the touch driving signal VLFD has a sine wave, the saturation of the integrator 40 can be solved by feedback of the delta-sigma ADC 24. That is, the sampling voltage of the integrator 40 may be tuned by feedback. As a result, the saturation of the integrator 40 can be solved.

Furthermore, when the touch driving signal VLFD has a square wave, a high frequency component can be removed by the low pass filter 34.

In a transition period of the square wave, a peak component may be included in the touch driving signal VLFD. The peak component may be attenuated by the low pass filter 34. The saturation of the integrator 40 can be solved by the peak component.

Furthermore, a harmonic frequency of the square wave may be attenuated by the low pass filter 34. Accordingly, pass band noise attributable to aliasing can be reduced in the digital signal DO outputted by the delta-sigma ADC 24. The aliasing means a phenomenon in which neighboring frequency spectra overlap.

As described above, in an embodiment of the present disclosure, a separate capacitor for tuning does not need to be configured on the side to which the touch sensing signal is inputted because auto-tuning is performed by the delta-sigma ADC 24.

An embodiment of the present disclosure can be simply configured using a small number of parts including the pre-amplification circuit 22 and the delta-sigma ADC 24 as described above.

That is, an embodiment of the present disclosure can reduce an area and the number of parts for the touch sensing signal processing circuit by adopting the delta-sigma analog to digital conversion method.

Accordingly, the touch sensing signal processing circuit can be configured to accommodate an increased number of channels corresponding to a reduced number of parts, and can further secure a touch sensing time that much and improve a signal to noise ratio by an increased touch sensing time.

Furthermore, the touch sensing signal processing circuit may achieve high-resolution analog-to-digital conversion performance by a simple construction, and can reduce power consumption per channel.

Furthermore, the touch sensing signal processing circuit according to an embodiment of the present disclosure can reinforce digital filtering by including the ADC for each channel.

What is claimed is:

1. A touch sensing signal processing circuit comprising:
   a pre-amplification circuit configured to compare a touch sensing signal corresponding to a change in capacitance of a sensing node for touch sensing and a touch driving signal for driving the touch sensing and to output sensing current corresponding to a result of the comparison; and a delta-sigma analog to digital converter (ADC) configured to generate a sampling voltage obtained by sampling the sensing current, output a digital signal corresponding to the sampling voltage, and tune the sampling voltage by using the digital signal, wherein the pre-amplification circuit includes a buffer configured to generate an output in accordance with first and second control signals, a low pass filter configured to filter peak components of the first and second control signals, and an output circuit having a same structure as an internal circuit of the buffer and output sensing current in accordance with the filtered first and second control signals.

2. The touch sensing signal processing circuit of claim 1, wherein the buffer is configured to generate an output corresponding to a difference between the touch sensing signal and the touch driving signal by the first control signal corresponding to the touch sensing signal of a first input stage and the second control signal corresponding to the touch driving signal of a second input stage and to feed the output back to the first input stage, wherein the output circuit is configured to output the sensing current mirrored from an internal current of the buffer for the output by using the first control signal and the second control signal; and wherein the low pass filter includes a filtering capacitor and configured to filter the first control signal and the second control signal transferred from the buffer to the output circuit by using the filtering capacitor.

3. The touch sensing signal processing circuit of claim 2, wherein the buffer is a unit gain buffer.

4. The touch sensing signal processing circuit of claim 2, wherein:

the filtering capacitor comprises a first capacitor and a second capacitor, the first capacitor filters a first peak component of the first control signal corresponding to the touch sensing signal, and the second capacitor filters a second peak component of the second control signal corresponding to the touch driving signal.

5. The touch sensing signal processing circuit of claim 2, wherein:

a current mirror ratio of an internal circuit for driving the output circuit and the internal current of the buffer is able to vary, and a range of the sensing current varies by the variation of the ratio.

6. The touch sensing signal processing circuit of claim 1, wherein the touch driving signal has a waveform and phase identical with a waveform and phase of the touch driving signal applied to the sensing node.

7. The touch sensing signal processing circuit of claim 1, wherein the touch driving signal is provided as one waveform selected among a sine wave and a square wave.

8. The touch sensing signal processing circuit of claim 1, wherein the delta-sigma ADC generates the sampling voltage obtained by integrating the sensing current, outputs a quantized digital signal by comparing the sampling voltage with a preset reference voltage, and tunes the sampling voltage by feeding the digital signal back.

9. The touch sensing signal processing circuit of claim 1, wherein the delta-sigma ADC comprises:

an integrator configured to generate the sampling voltage by integrating the sensing current;

a comparator configured to compare the sampling voltage with a preset reference voltage and output the digital signal having a value quantized based on a level of the sampling voltage; and a digital to analog converter (DAC) configured to receive the digital signal and tune the sampling voltage by feedback of the digital signal.

10. The touch sensing signal processing circuit of claim 9, wherein:

the integrator is configured using a variable capacitor, and the variable capacitor has the sampling voltage charged with the sensing current.

11. The touch sensing signal processing circuit of claim 9, wherein the DAC receives the digital signal, performs an operation of lowering the sampling voltage of the integrator in response to the digital signal having a logic high value, and performs an operation or raising the sampling voltage of the integrator in response to the digital signal having a logic low value.

12. The touch sensing signal processing circuit of claim 9, wherein the DAC applies positive charges (+) or negative charges (−) to the integrator in order to tune the sampling voltage.

13. The touch sensing signal processing circuit of claim 9, wherein the DAC charges the integrator with a current or discharges a current of the integrator in order to tune the sampling voltage.

14. The touch sensing signal processing circuit of claim 1, further comprising a logic filter configured to output a logic signal obtained by filtering out noise of the digital signal, wherein the logic filter comprises one filter selected among a decimation filter and a sliding discrete Fourier transfer (SDFT) filter, and removes quantization noise of a non-signal band from the digital signal by the selected filter.

* * * * *